US010301488B2

(12) United States Patent
Okamoto et al.

(10) Patent No.: US 10,301,488 B2
(45) Date of Patent: May 28, 2019

(54) CONDUCTIVE INK COMPOSITION, METHOD FOR PRODUCING CONDUCTIVE PATTERNS, AND CONDUCTIVE CIRCUIT

(71) Applicant: DIC Corporation, Tokyo (JP)

(72) Inventors: Tomoko Okamoto, Tokyo (JP); Yasuhiro Sente, Tokyo (JP); Yoshinori Katayama, Tokyo (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/388,733

(22) PCT Filed: Mar. 28, 2013

(86) PCT No.: PCT/JP2013/059315
§ 371 (c)(1),
(2) Date: Sep. 26, 2014

(87) PCT Pub. No.: WO2013/147047
PCT Pub. Date: Oct. 3, 2013

(65) Prior Publication Data
US 2015/0322275 A1 Nov. 12, 2015

(30) Foreign Application Priority Data

Mar. 29, 2012 (JP) ................................ 2012-076538

(51) Int. Cl.
| H05K 1/02 | (2006.01) |
| C09D 11/037 | (2014.01) |
| H01B 13/00 | (2006.01) |
| H05K 1/09 | (2006.01) |
| H01B 1/22 | (2006.01) |
| C09D 11/102 | (2014.01) |
| C09D 11/52 | (2014.01) |
| H05K 3/12 | (2006.01) |

(52) U.S. Cl.
CPC .......... *C09D 11/037* (2013.01); *C09D 11/102* (2013.01); *C09D 11/52* (2013.01); *H01B 1/22* (2013.01); *H01B 13/0026* (2013.01); *H05K 1/095* (2013.01); *H05K 1/097* (2013.01); *H05K 3/1216* (2013.01); *H05K 3/1275* (2013.01)

(58) Field of Classification Search
CPC .. H05K 1/02; H05K 1/03; H05K 1/09; H05K 1/11; H05K 3/12; H05K 3/46; H05K 9/00; H01L 21/84; B32B 3/00; B32B 3/10; H01B 1/22
USPC .... 174/257, 126.1, 388, 389, 250, 255, 261; 428/172, 195.1, 267, 549; 430/114, 115; 514/769; 252/514
See application file for complete search history.

(56) References Cited

U.S. PATENT DOCUMENTS

| 3,833,174 | A | * | 9/1974 | Sarzen | B05B 5/057 239/122 |
| 4,053,329 | A | * | 10/1977 | Castellucci | C23C 22/68 148/250 |
| 4,444,954 | A | * | 4/1984 | Mels | C08G 18/0814 204/500 |
| 4,444,955 | A | * | 4/1984 | Mels | C08G 18/0814 204/500 |
| 4,561,952 | A | * | 12/1985 | Mels | C08G 18/0814 204/500 |
| 4,619,966 | A | * | 10/1986 | Schafer | C08G 18/0819 427/385.5 |
| 4,668,360 | A | * | 5/1987 | Mels | C09D 5/4411 204/500 |
| 4,895,921 | A | * | 1/1990 | Schafer | C07D 251/34 427/385.5 |
| 4,918,135 | A | * | 4/1990 | Probst | C09D 133/06 524/457 |
| 4,925,885 | A | * | 5/1990 | Rosthauser | C08G 18/0819 523/415 |
| 5,057,245 | A | * | 10/1991 | Frentzel | C08G 18/6204 252/503 |
| 5,114,796 | A | * | 5/1992 | Frentzel | C08G 18/6204 428/521 |
| 5,139,819 | A | * | 8/1992 | Frentzel | C08G 18/6204 427/121 |
| 5,203,884 | A | * | 4/1993 | Buchanan | B24D 3/28 51/293 |
| 5,364,726 | A | * | 11/1994 | Morrison | G03G 9/12 430/115 |
| 5,395,724 | A | * | 3/1995 | Morrison | G03G 9/12 430/114 |
| 5,450,220 | A | * | 9/1995 | Onishi | C09K 19/544 349/89 |

(Continued)

FOREIGN PATENT DOCUMENTS

| JP | 2002-161123 A | 6/2002 |
| JP | 2006-514418 A | 4/2006 |
| JP | 2009-024066 A | 2/2009 |
| JP | 2009-026558 A | 2/2009 |
| JP | 2011-246498 A | 12/2011 |
| JP | 2011-252140 A | 12/2011 |

OTHER PUBLICATIONS

International Search Report dated Jul. 9, 2013, issued for PCT/JP2013/059315.

Primary Examiner — Xiaoliang Chen
(74) Attorney, Agent, or Firm — Locke Lord LLP; James E. Armstrong, IV; Nicholas J. DiCeglie, Jr.

(57) ABSTRACT

[Object] To provide a conductive ink composition which allows formation of a high resolution conductive pattern, and which can provide a high conductivity pattern by firing at a lower temperature and in a shorter time.
[Solution] The aforementioned object is achieved by including a conductive filler, an epoxy compound, a blocked polyisocyanate in which a blocking agent is an active methylene compound and/or a pyrazole compound, a reaction catalyst for the blocked polyisocyanate, and an organic solvent as essential components. A conductive ink composition of the present invention can be fired at a lower temperature and in a shorter time and allows printing of a higher resolution conductive pattern.

8 Claims, No Drawings

(56) References Cited

U.S. PATENT DOCUMENTS

| | | | | |
|---|---|---|---|---|
| 5,554,664 A * | 9/1996 | Lamanna | C08F 2/50 | 522/25 |
| 5,665,852 A * | 9/1997 | Singh | C07D 487/04 | 528/248 |
| 5,718,817 A * | 2/1998 | Bossert | C08G 18/161 | 204/501 |
| 5,854,360 A * | 12/1998 | Matsunaga | C08G 18/1875 | 525/452 |
| 6,001,900 A * | 12/1999 | Bossert | C08G 18/161 | 204/506 |
| 6,006,133 A * | 12/1999 | Lessar | A61N 1/375 | 29/25.03 |
| 6,009,348 A * | 12/1999 | Rorvick | A61N 1/375 | 29/25.03 |
| 6,032,075 A * | 2/2000 | Pignato | A61N 1/375 | 29/25.03 |
| 6,042,624 A * | 3/2000 | Breyen | A61N 1/375 | 29/25.03 |
| 6,099,600 A * | 8/2000 | Yan | H01G 9/00 | 29/25.03 |
| 6,106,984 A * | 8/2000 | Kato | B41C 1/1041 | 430/302 |
| 6,118,652 A * | 9/2000 | Casby | A61N 1/375 | 361/503 |
| 6,141,205 A * | 10/2000 | Nutzman | A61N 1/3956 | 361/509 |
| 6,157,531 A * | 12/2000 | Breyen | A61N 1/375 | 361/509 |
| 6,183,923 B1 * | 2/2001 | Kato | B41C 1/1066 | 428/195.1 |
| 6,402,793 B1 * | 6/2002 | Miltich | A61K 8/4973 | 549/437 |
| 6,403,670 B1 * | 6/2002 | Ishidoya | C08G 18/683 | 522/6 |
| 6,445,948 B1 * | 9/2002 | Somdahl | A61N 1/375 | 607/2 |
| 6,459,566 B1 * | 10/2002 | Casby | A61N 1/375 | 361/503 |
| 6,477,037 B1 * | 11/2002 | Nielsen | A61N 1/375 | 361/509 |
| 6,493,212 B1 * | 12/2002 | Clarke | A61N 1/372 | 361/509 |
| 6,660,793 B1 * | 12/2003 | McIntyre | C09D 5/027 | 524/441 |
| 2002/0108221 A1 * | 8/2002 | Miltich | A61N 1/375 | 29/25.41 |
| 2003/0175603 A1 * | 9/2003 | Nakata | C08G 8/10 | 430/58.1 |
| 2003/0215731 A1 * | 11/2003 | Saiki | G03G 9/0827 | 430/110.3 |
| 2004/0129978 A1 * | 7/2004 | Hirai | H01L 27/283 | 257/347 |
| 2004/0240915 A1 * | 12/2004 | Nakayama | G03G 21/0017 | 399/345 |
| 2005/0011384 A1 * | 1/2005 | Sampei | B41M 1/06 | 101/483 |
| 2005/0057630 A1 * | 3/2005 | Hiroki | C09D 11/30 | 347/100 |
| 2005/0064154 A1 * | 3/2005 | Aylward | B41M 3/006 | 428/195.1 |
| 2005/0068406 A1 * | 3/2005 | Koyama | B41J 2/33515 | 347/203 |
| 2005/0090582 A1 * | 4/2005 | Ushirogouchi | C09B 67/0013 | 523/160 |
| 2005/0214045 A1 * | 9/2005 | Ohta | G03G 21/0011 | 399/350 |
| 2005/0259300 A1 * | 11/2005 | Burberry | G02F 1/1334 | 359/13 |
| 2006/0024100 A1 * | 2/2006 | Ohta | G03G 21/0011 | 399/350 |
| 2006/0025497 A1 * | 2/2006 | Ushirogouchi | C09D 11/101 | 523/160 |
| 2006/0110580 A1 * | 5/2006 | Aylward | G02B 26/004 | 428/172 |
| 2006/0189716 A1 * | 8/2006 | Ushirogouchi | C09D 11/101 | 523/160 |
| 2006/0232735 A1 * | 10/2006 | Hokazono | B32B 27/08 | 349/122 |
| 2006/0289842 A1 | 12/2006 | Craig et al. | | |
| 2007/0048509 A1 * | 3/2007 | Yoneyama | B32B 17/10018 | 428/212 |
| 2007/0048513 A1 * | 3/2007 | Okamoto | G02B 1/111 | 428/313.3 |
| 2007/0051634 A1 * | 3/2007 | Poole | C09D 5/084 | 205/109 |
| 2007/0065660 A1 * | 3/2007 | Okamoto | C09D 5/24 | 428/328 |
| 2007/0139781 A1 * | 6/2007 | Inoue | G02B 5/0242 | 359/599 |
| 2007/0146887 A1 * | 6/2007 | Ikeda | G02B 1/111 | 359/586 |
| 2007/0161163 A1 * | 7/2007 | Hirai | H01L 27/283 | 438/149 |
| 2008/0197349 A1 * | 8/2008 | Hirai | H01L 27/283 | 257/40 |
| 2008/0242773 A1 * | 10/2008 | Ushirogouchi | C09B 67/0013 | 524/88 |
| 2008/0273066 A1 * | 11/2008 | Hiroki | C09D 11/30 | 347/85 |
| 2008/0299473 A1 * | 12/2008 | Inagaki | G03G 5/0507 | 430/58.05 |
| 2009/0004487 A1 * | 1/2009 | Katsuta | C09D 5/002 | 428/457 |
| 2009/0008142 A1 * | 1/2009 | Shimizu | B32B 5/18 | 174/261 |
| 2009/0060574 A1 * | 3/2009 | Shibata | G03G 21/08 | 399/128 |
| 2009/0081373 A1 * | 3/2009 | Choate | B05D 7/53 | 427/385.5 |
| 2009/0163656 A1 * | 6/2009 | DeLuca | C08G 77/58 | 524/837 |
| 2009/0186962 A1 * | 7/2009 | Kondo | C08G 59/184 | 523/351 |
| 2009/0246469 A1 * | 10/2009 | Kawashima | B41C 1/05 | 428/156 |
| 2009/0257788 A1 * | 10/2009 | Matsuda | G03G 9/0833 | 399/274 |
| 2010/0003474 A1 * | 1/2010 | Kotsubo | C23C 18/1608 | 428/201 |
| 2010/0019319 A1 * | 1/2010 | Hirai | H01L 27/283 | 257/347 |
| 2010/0126767 A1 * | 5/2010 | Kotsubo | C23C 18/1608 | 174/389 |
| 2010/0140564 A1 * | 6/2010 | Overbreek | C09D 11/101 | 252/514 |
| 2010/0270055 A1 * | 10/2010 | Zheng | H01L 51/004 | 174/126.1 |
| 2010/0316944 A1 * | 12/2010 | Nakajima | G03G 9/0804 | 430/105 |
| 2011/0021916 A1 * | 1/2011 | Morita | A61B 8/00 | 600/443 |
| 2011/0081527 A1 * | 4/2011 | Yamato | H05K 3/386 | 428/195.1 |
| 2011/0122177 A1 * | 5/2011 | Hiroki | C09D 11/30 | 347/6 |
| 2011/0214852 A1 * | 9/2011 | Wang | C09K 5/00 | 165/185 |
| 2011/0228432 A1 * | 9/2011 | Onishi | C08G 18/0823 | 361/56 |
| 2012/0003467 A1 * | 1/2012 | Suzuki | B32B 33/00 | 428/336 |
| 2012/0125437 A1 * | 5/2012 | Okawara | H01L 31/048 | 136/259 |
| 2012/0142829 A1 * | 6/2012 | Ichinose | C08G 73/14 | 524/99 |
| 2012/0225241 A1 * | 9/2012 | Kashima | B29C 45/0055 | 428/80 |

(56) References Cited

U.S. PATENT DOCUMENTS

| | | | |
|---|---|---|---|
| 2012/0283336 A1* | 11/2012 | Grigorenko | B22F 1/0022 514/769 |
| 2013/0236831 A1* | 9/2013 | Matsuoka | G03G 9/08764 430/124.1 |
| 2013/0267663 A1* | 10/2013 | Sato | C08G 59/184 525/391 |
| 2013/0309489 A1* | 11/2013 | Murakami | C08L 79/08 428/355 CN |
| 2014/0004371 A1* | 1/2014 | Chung | H01B 1/02 428/549 |
| 2014/0061970 A1* | 3/2014 | Sekine | B82Y 10/00 264/293 |
| 2014/0086654 A1* | 3/2014 | Kojima | G03G 21/0017 399/350 |
| 2014/0144684 A1* | 5/2014 | Saitou | H05K 1/095 174/257 |

* cited by examiner

CONDUCTIVE INK COMPOSITION, METHOD FOR PRODUCING CONDUCTIVE PATTERNS, AND CONDUCTIVE CIRCUIT

TECHNICAL FIELD

The present invention relates to a conductive ink composition for forming a conductive film, a method for producing a conductive pattern, and a conductive circuit.

BACKGROUND ART

Printing methods or etching methods are known as methods for forming a conductive pattern of conductive circuits, electrodes, and the like used in touch panels, electronic paper, and numerous electronic components.

Formation of a conductive pattern by the etching method requires the following process: a patterned resist film is formed by photolithography on a substrate on which a variety of metal films are formed by vapor deposition; subsequently, the unnecessary part of the vapor deposited metal films is removed by chemical or electrochemical dissolution; and finally, the resist film is removed. Thus, this process is remarkably complicated, and the productivity is poor.

The printing method allows mass production of the desired pattern at a low cost. Furthermore, conductivity can be easily provided by drying or hardening the printed coating film.

Flexographic printing, screen printing, gravure printing, gravure offset printing, inkjet printing, etc. have been proposed as these printing methods in accordance with the line width, the thickness, and the production speed of the pattern to be formed.

As the printed pattern, the formation of a high-resolution conductive pattern having a line width of 50 μm or less has been demanded from viewpoints such as the miniaturization and improvement of design of electronic devices.

Further, in view of the increased demands for reduction of the thickness, weight savings, and flexibility of electronic devices, and roll to roll printing having a high productivity, conductive inks in which high conductivity, substrate adhesion, film hardness, etc., can be obtained by printing on a plastic film and firing at a low temperature for a short period of time have been demanded. Furthermore, there has been a demand for conductive inks that can provide the above-mentioned properties when printing, among plastic films, a low cost, high transparency PET film or a transparent conductive film in which an ITO film is formed on a PET film.

Under such circumstances, a thermosetting electroconductive paste composition containing a silver powder, a thermosetting component, and a solvent, the thermosetting component including a blocked polyisocyanate compound, an epoxy resin, and a curing agent selected from the group consisting of amines, acid anhydrides, and imidazoles is known (PTL 1). However, there are the drawbacks that, because the firing temperature is 150° C. and an isocyanate reaction catalyst is not contained, the curing temperature is high, and because the blocking agent of the isocyanate is MEK oxime, the firing time is long.

Further, a conductive paste composition containing an organic binder resin, an electroconductive powder, a colorant, an organic solvent, and a crosslinking agent, wherein the number average molecular weight of the organic binder resin is in the range of 3000 to 50000 is known (PTL 2). This technology, in the same manner as the technology of the aforementioned PTL 1, also has the problem that, because the firing conditions are 130° C. for 30 minutes and an isocyanate reaction catalyst is not contained, the firing time is long, and because the blocking agent of the isocyanate is MEK oxime, the firing time is long.

Furthermore, a conductive paste composition containing an organic binder resin, an electroconductive powder, a colorant, an organic solvent, and a crosslinking agent, wherein the electroconductive powder contains a powder having a spherical form and the content of this powder is 50 to 95 mass % relative to the entire amount of the electroconductive powder is known (PTL 3). This technology has the same problem as the aforementioned technology.

PTL 1: Japanese Unexamined Patent Application Publication No. 2002-161123
PTL 2: Japanese Unexamined Patent Application Publication No. 2009-26558
PTL 3: Japanese Unexamined Patent Application Publication No. 2009-24066

DISCLOSURE OF INVENTION

Technical Problem

Therefore, an object of the present invention is to provide a conductive ink composition which allows formation of a high-resolution conductive pattern and which can provide a pattern having a high conductivity by firing at a lower temperature for a shorter period of time.

Solution to Problem

The present inventors performed keen research in order to achieve the aforementioned object, and as a result, discovered that the aforementioned object can be achieved by using a specific blocked polyisocyanate compound and a reaction catalyst for the blocked polyisocyanate, and completed the present invention.

Namely, the present invention provides a conductive ink composition including a conductive filler, an epoxy compound, a blocked polyisocyanate in which a blocking agent is an active methylene compound and/or a pyrazole compound, a reaction catalyst for the blocked polyisocyanate, and an organic solvent as essential components.

Further, the present invention provides a method for producing a conductive pattern, the method including applying the aforementioned conductive ink composition to a non-heat resistant substrate and heating the conductive ink composition.

Furthermore, the present invention provides a conductive circuit including a conductive pattern in which a cured coating film of the aforementioned conductive ink composition is formed on a non-heat resistant substrate.

Advantageous Effects of Invention

A conductive ink composition of the present invention makes firing at a lower temperature and for a shorter time period possible by including a blocked polyisocyanate in which a blocking agent is either an active methylene compound or a pyrazole compound and a reaction catalyst for the blocked polyisocyanate. Therefore, even when a non-heat resistant substrate such as a PET film is used, deformation of the film does not occur, a conductive pattern having a high resolution and high conductivity can be produced at a high productivity, and a high-resolution conductive pattern can be formed.

BEST MODE FOR CARRYING OUT INVENTION (Conductive Filler)

Publicly known substances may be used as the conductive filler in the present invention. Examples include nickel, copper, gold, silver, aluminum, zinc, nickel, tin, lead, chromium, platinum, palladium, tungsten, molybdenum, etc.; alloys and mixtures of two or more thereof; and compounds of these metals, the compounds having a good conductivity. In particular, silver powder is preferable as it easily realizes stable conductivity and the thermal conductivity property is also good.

(Silver Powder)

In the case of using silver powder as the conductive filler of the present invention, using a spherical silver powder having a median particle size (D50) of 0.1 to 10 μm as the average particle size is preferable, and 0.1 to 3 μm is more preferable. If in this range, the flowability of the conductive ink composition can further improve; and, even when specific printing methods such as flexographic printing, screen printing, gravure printing, and gravure offset printing are employed and continuous printing is performed with such printers, good conductive pattern printing products can be easily obtained with stability and with a low probability of the occurrence of problems.

Examples of the silver powder include AG2-1C (manufactured by DOWA Electronics Materials Co., Ltd., average particle size D50: 0.8 μm), SPQ03S (manufactured by Mitsui Mining and Smelting Co., Ltd., average particle size D50: 0.5 μm), EHD (manufactured by Mitsui Mining and Smelting Co., Ltd., average particle size D50: 0.5 μm), Silbest C-34 (manufactured by Tokuriki Chemical Research Co., Ltd., average particle size D50: 0.35 μm), AG2-1 (manufactured by DOWA Electronics Materials Co., Ltd., average particle size D50: 1.3 μm), and Silbest AgS-050 (manufactured by Tokuriki Chemical Research Co., Ltd., average particle size D50: 1.4 μm).

(Epoxy Compound)

An epoxy compound is used in the present invention. The epoxy resin to be used is not specifically limited, but using an aliphatic epoxy compound is preferable. Specifically, preferred examples include epoxy compounds such as glycidyl ethers of polyethylene glycol, polypropylene glycol, hexanediol, trimethylolpropane, glycerin, pentaerythritol, sorbitol, etc. and alicyclic epoxy compounds. Thereamong, glycidyl ethers of polyethylene glycol, polypropylene glycol, trimethylolpropane, etc., are more preferable.

Aliphatic epoxy compounds are liquid or semi-solid at room temperature, and thus, can make the flowability of the conductive ink composition good. Accordingly, even when specific printing methods such as flexographic printing, screen printing, gravure printing, and gravure offset printing are employed and continuous printing is performed with such printers, good conductive pattern printing products can be easily obtained with stability and with a low probability of the occurrence of problems. Some aromatic epoxy compounds are also liquid or semi-solid, but the use thereof is not preferable for the reason of safety.

Use of such an epoxy compound in combination with a blocked polyisocyanate can provide a coating film having an excellent conductivity, a greater toughness and excellent solvent resistance.

(Other Resins)

The present invention can use other publicly known film-formable thermoplastic resins as long as advantages of the present invention are not impaired. For example, polyester resin, vinyl chloride resin, acetal resin, acrylic resin, polyester resin, polyurethane resin, etc., can be mentioned as other resins which can be used in the present invention. These can be used singly, or two or more can be used together. Alternatively, a copolymer based on these resin systems can be used.

(Blocked Polyisocyanate)

In the present invention, regarding the blocked polyisocyanate compound in which the blocking agent is thermally dissociated to produce free isocyanate groups, a blocked polyisocyanate is used that is constituted by a blocking agent and a polyisocyanate compound, the blocking agent being either an active methylene compound or a pyrazole compound. The use of such compounds is not specifically limited, but specifically, when using a plastic film that is a PET film as a substrate, if a blocked polyisocyanate compound in which a blocking agent provides isocyanate groups at a temperature of 70 to 125° C. is contained in the conductive ink composition, a conductive pattern can be formed on the PET film without generating warpage etc. in the PET film.

The blocked polyisocyanate used in the present invention will be further explained in detail. The type of blocked polyisocyanate compounds is not specifically limited. Examples of blocked polyisocyanate compounds include aromatic, aliphatic, and alicyclic diisocyanates, dimers or trimers made by modification of diisocyanates, and terminal isocyanate group-containing compounds. Such compounds may be used singly or in combinations. Examples of the aromatic diisocyanates include 2,4-toluene diisocyanate, 2,6-toluene diisocyanate, diphenylmethane-4,4'-diisocyanate, diphenylmethane-2,4'-diisocyanate, and dianisidine diisocyanate. Examples of the aliphatic diisocyanates include 1,4-tetramethylene diisocyanate, 1,5-pentamethylene diisocyanate, 1,6-hexamethylene diisocyanate (hereinafter, referred to as HMDI), and 2,2,4-trimethyl-1,6-hexamethylene diisocyanate.

Examples of the alicyclic diisocyanates include lysine diisocyanate, isophorone diisocyanate (hereinafter, referred to as IPDI), 1,3-bis(isocyanatomethyl)-cyclohexane, 4,4'-dicyclohexylmethane diisocyanate, and dimers or trimers made by modification of these diisocyanates. Examples of a process of the modification include biuret formation and isocyanurate formation. For example, the terminal isocyanate group-containing compounds may be obtained by reacting the above-mentioned di- or polyisocyanate compounds with active hydrogen compounds such as ethylene glycol, propylene glycol, trimethylolpropane, ethanolamine, polyester polyol, polyether polyol, and polyamide.

The blocking agent is either an active methylene compound or a pyrazole compound. Specifically, Meldrum's acid, dialkyl malonate, alkyl acetoacetate, 2-acetoacetoxyethyl methacrylate, acetylacetone, ethyl cyanoacetate, etc., may be provided as the active methylene compound; and pyrazole, 3,5-dimethylpyrazole, 3-methylpyrazole, 4-benzyl-3,5-dimethylpyrazole, 4-nitro-3,5-dimethylpyrazole, 4-bromo-3,5-dimethylpyrazole, 3-methyl-5-phenylpyrazole, etc., may be provided as the pyrazole compound. Thereamong, diethyl malonate, 3,5-dimethylpyrazole, etc. are preferable. As commercial products, Duranate MF-K60B (manufactured by Asahi Kasei Chemicals Corporation) and Desmodur BL-3475 (manufactured by Sumika Bayer Urethane Co., Ltd.) can be provided as the active methylene compound; TRIXENE BI-7982 (manufactured by Baxenden Chemicals Ltd.) can be provided as the pyrazole compound; and TRIXENE BI-7992 (manufactured by Baxenden Chemicals Ltd.) can be provided as a mixture type of the active methylene and the pyrazole compound.

When formulating the conductive ink composition of the present invention, using 50 to 500 parts of the blocked polyisocyanate compound per 100 parts of the non-volatile component of the epoxy compound, in terms of mass, is preferable in the point of increasing the properties of a conductive pattern to be finally obtained, such as conductivity, toughness, and solvent resistance.

The above-mentioned blocked polyisocyanate compound in which the blocking agent is thermally disassociated to generate free isocyanate groups is easily obtained by reacting the blocking agent with a polyisocyanate compound having free isocyanate groups until, under monitoring of the infrared absorption spectrum, an intrinsic absorption spectrum based on the isocyanate groups disappears.

(Reaction Catalyst for the Blocked Polyisocyanate)

The reaction catalyst for the blocked polyisocyanate used in the present invention is not specifically limited, but it is preferable that the reaction catalyst for the blocked polyisocyanate is an organic ammonium salt or an organic amidine salt. Specifically, examples of the organic ammonium salt include tetra-alkyl ammonium halide, tetraalkyl ammonium hydroxide, and tetraalkyl ammonium organic acid salt; and examples of the organic amidine salt include phenol salts, octylic acid salts, oleic acid salts, p-toluenesulfonic acid salts, and formic acid salts of 1,8-diazabicyclo[5.4.0]undecene-7 (hereinafter, referred to as DBU) and 1,5-diazabicyclo[4.3.0]nonene-5 (hereinafter, referred to as DBN). Thereamong, it is preferable to use DBU-octylic acid salt, DBN-octylic acid salt, etc. As the commercial products, TOYOCAT-TR20 (manufactured by Tosoh Corporation) may be provided as the organic ammonium salt; and U-CAT SA1, U-CAT SA102, U-CAT SA106, U-CAT SA506, U-CAT SA603, and U-CAT SA1102 (manufactured by San-Apro Ltd.) may be provided as the organic amidine salts.

(Organic Solvent)

The thermosetting resin and the thermoplastic resin which can be used in the present invention are for the most part solid at 25° C. Thus, generally, for example, it is necessary to dissolve such a resin in a liquid medium, and then apply and print a fine line pattern on a substrate. Therefore, when selecting such a resin, it is necessary to refer to the solubility in the liquid medium.

From this viewpoint, a conductive ink composition of the present invention uses an organic compound which dissolves the resin, is nonreactive with the resin, and is liquid at 25° C.

Such organic compounds are so-called organic solvents and there are no limitations on the type thereof. Examples of the organic solvents include esters, ketones, chlorides, alcohols, ethers, hydrocarbons, and ether esters. Specific examples include methyl ethyl ketone, methyl isobutyl ketone, cyclohexanone, n-butanol, iso-butanol, isophorone, γ-butyrolactone, DBE (manufactured by InVista Japan K.K.), N-methyl-2-pyrrolidone, ethyl carbitol acetate, butyl cellosolve acetate, and propylene glycol monoalkyl ether acetate. These may be used singly, or two or more types may be used together. Thereamong, regardless of the type of printing method described below, in order to easily obtain a conductive pattern, using an organic solvent having a boiling point of 100 to 250° C. is preferable in the point of the drying rate.

As explained below, when using a gravure printing method or gravure offset printing method, it is preferable that the organic solvent has a silicone blanket swelling ratio of 5 to 20%, and more preferably, the organic solvent is an ether ester-series organic solvent such as diethylene glycol monobutyl ether acetate or diethylene glycol monoethyl ether acetate.

The conductive ink composition of the present invention can be produced by mixing a conductive filler, an epoxy compound, a blocked polyisocyanate in which the blocking agent is either an active methylene compound or a pyrazole compound, a reaction catalyst for the blocked polyisocyanate, and an organic solvent. When formulating the conductive ink composition, using 0.1 to 10 parts of epoxy resin in terms of non-volatile component and 5 to 30 parts of organic solvent per 100 parts of silver powder, in terms of mass, is preferable from the points that the properties of a conductive pattern to be finally obtained are increased and the conductive pattern formation conditions can be mitigated.

Silver powder The content of the conductive filler in the conductive ink composition is preferably 60 to 95 mass %, and is more preferably 70 to 90 mass %. If in this range, the density of the filler in the film is sufficient and a good conductivity can be obtained, and it becomes easy to prepare in a paste form having flowability.

The content of the epoxy resin in the conductive ink composition is preferably 0.1 to 10 mass %, and is more preferably 1 to 5 mass %. This range is preferable in the point of increasing the properties of a conductive pattern to be finally obtained, such as conductivity, adhesion to a substrate, and solvent resistance.

The content of the blocked isocyanate in the conductive ink composition is preferably 0.5 to 15 wt % in terms of non-volatile component, and is more preferably 2 to 10 wt %. This range is preferable in the point of increasing the properties of a conductive pattern to be finally obtained, such as conductivity, adhesion to a substrate, and solvent resistance.

The content of the reaction catalyst for the blocked polyisocyanate in the conductive ink composition is preferably 0.05 to 3 wt %, and is more preferably 0.1 to 1 wt %. This range is preferable in the point of increasing the properties of a conductive pattern to be finally obtained, such as conductivity and solvent resistance.

The content of the organic solvent in the conductive ink composition is preferably 5 to 30 mass %, and is more preferably 7 to 15 mass %. If in this range, the paste viscosity becomes more suitable, specifically, a higher resolution conductive pattern can be formed by gravure printing or gravure offset printing without the occurrence of pinhole defects in corner portions or the intersections of a matrix of image lines.

Other than the above-mentioned components, various additives such as dispersants, antifoaming agents, release agents, leveling agents, and plasticizers can be appropriately blended in appropriate amounts in the conductive ink composition of the present invention in accordance with need.

A conductive ink composition of the present invention can form a conductive pattern by a desired method, for example, by applying or printing on a substrate of a plastic film, a ceramic film, a silicon wafer, or a glass or metal plate.

A conductive ink composition of the present invention can form a conductive pattern on a desired substrate by, for example, printing by a printing method of flexographic printing, screen printing, gravure printing, or gravure offset printing.

A method for forming a conductive pattern from a conductive ink composition of the present invention may be a method including applying a conductive ink composition of the present invention to a non-heat resistant substrate and heating the conductive ink composition. More preferably, there is the following method for forming a conductive pattern: the so-called gravure offset printing is performed by filling the conductive ink composition in an intaglio plate, transferring the filled ink composition to a blanket roll, and then performing transfer-coating of the ink composition from the blanket roll to a non-conductive support body etc., so that the desired pattern is printed on the surface of the non-heat resistant substrate etc.; and then heating is performed.

In this case, examples of the intaglio printing plate include a normal gravure plate; an intaglio plate formed by exposing, developing, and washing a photosensitive resin on a glass plate; and an intaglio plate formed by chemical etching and laser etching a glass plate, a metal plate, or a metal roll.

A silicone blanket is a sheet having a layer structure including, for example, a silicone rubber layer, a PET layer, and a sponge layer. Normally, the blanket can be used so as to be wound around a rigid cylinder that is referred to as a blanket cylinder.

When applying the aforementioned gravure offset printing method to a method for forming a conductive pattern from a conductive ink composition of the present invention, the silicone blanket is required to allow transfer from the intaglio plate and to allow transfer to the substrate. To achieve sufficient transfer to the substrate, it is necessary for the surface of the blanket to absorb a certain proportion of the liquid component of the conductive ink composition. If the absorption is insufficient, the conductive ink composition layer easily delaminates at the time of transfer to the substrate. Conversely, if absorption occurs beyond the certain proportion, there are the problems that the conductive ink composition dries on the surface of the blanket and defects easily occur during transfer to the substrate.

By setting the viscosity of the conductive ink composition at 25° C. to 1 to 50 Pa·s, when using the gravure offset printing method to continuously perform printing of a conductive pattern, pinhole defects easily occur in corner portions or the intersections of a matrix of image lines, good conductive fine line patterns can be formed, and the problems in terms of inking to the intaglio plate and transfer from the intaglio plate to the blanket tend not to occur.

A conductive pattern which is formed from a conductive ink composition of the present invention may include an image line having a large line width so as to form a solid pattern. However, advantages provided by use of a conductive ink composition of the present invention are brought about remarkably when, as described above, image lines having a smaller line width than before are formed on substrates.

Further, a conductive pattern can be formed from a conductive ink composition of the present invention at a lower temperature and in a shorter time period than before. Thus, advantages of a conductive ink composition of the present invention are brought about remarkably when conductive patterns are formed on general-purpose plastic films formed of PET or the like in which the thermal resistance is lower and thermal deformation occurs more easily than substrates having a high thermal resistance such as ceramic films and glass or metal plates. Therefore, a conductive pattern in which the cured coating film of a conductive ink composition of the present invention is formed on a non-heat resistant substrate can be preferably used as a conductive circuit formed on the non-heat resistant substrate.

Substrates on which conductive patterns are formed using a conductive ink composition of the present invention in the above-described manner by printing on various kinds of substrates by various kinds of printing methods can be subjected to, as conductive circuits, for example, wiring in accordance with need, so that various kinds of electric components and electronic components can be provided. Specifically, a conductive ink composition of the present invention is excellent in adhesion to a transparent conductive film such as a transparent ITO electrode.

Examples of final products include an extraction electrode of a touch panel, an extraction electrode of a display, electronic paper, a solar cell, and other wiring components.

EXAMPLES

Below, the present invention will be explained in detail with examples. The symbol "%" is "mass %" unless otherwise noted.

Conductive ink compositions of the present invention serving as Examples and conventional conductive ink compositions serving as Comparative examples were prepared by using raw materials at the parts by mass described in Table 1 and sufficiently mixing these raw materials.

For each of these conductive ink compositions, a property of the conductive ink composition itself and properties of a conductive pattern obtained from the conductive ink composition were evaluated for the following measurement items. The evaluation results are collectively shown in the following Table 1 and Table 2.

(Volume Resistivity)

The conductive ink composition was applied to a transparent conductive film (ITO film surface) using an applicator so as to provide a film thickness of 4 μm after drying and dried at 125° C. for 10 minutes. The ink coating film was measured with a Loresta GP MCP-T610 (manufactured by Mitsubishi Chemical Corporation) by the four terminal method.

(Substrate Adhesion)

An ink coating film prepared as in the evaluation of volume resistivity was subjected to testing by the procedures of ISO2409 (Paints and varnishes-Cross-cut test) and was evaluated in accordance with the following criteria.

On the ink surface, 11 orthogonal vertical and horizontal lines were drawn at 1 mm intervals so as to penetrate the ink coating film by a cutter knife; Sellotape (Registered Trademark) was adhered so as to cover the 100 cut squares; and the end of the tape was gripped and peeled for 0.5 to 1 second. The cross-cut portion of the ink coating film was observed and classified into the following Classifications 0 to 5 in accordance with the surface condition. Classification 0 and Classification 1 were deemed to be acceptable.

Classification 0: The edge of the cut was completely smooth, and there was no peeling in any of the cut squares.
Classification 1: No more than 5% of the cross-cut squares were affected.
Classification 2: More than 5% and no more than 15% of the cross-cut squares were affected.
Classification 3: More than 15% and no more than 35% of the cross-cut squares were affected.
Classification 4: More than 35% and no more than 65% of the cross-cut squares were affected.
Classification 5: The extent of the peeling cannot be classified even by Classification 4.

(Printability)

A conductive ink composition of the present invention was used to perform gravure offset printing by the following method, so that a conductive circuit was formed.

After inking of the conductive ink composition on an intaglio plate made of glass by a doctor blade, the plate was pressed to and contacted with a cylinder wound with a blanket, and a desired pattern was transferred onto the blanket. Then, the coating film on the blanket was pressed and transferred to a transparent conductive film serving as a substrate to thereby form a conductive circuit having a line width of 40 μm to 100 μm. In the above-mentioned conductive circuit, lines having a line width of 40 μm were observed with a microscope, and the thin line reproducibility was evaluated in accordance with the following criteria.
Excellent: The linearity of the lines is specifically excellent and there are no disconnected parts.
Good: The linearity of the lines is excellent and there are no disconnected parts.
Poor: The linearity of the lines is poor and there are disconnected parts.
[Table 1]

TABLE 1

|   |   | Ex. 1 | Ex. 2 | Ex. 3 | Ex. 4 | Ex. 5 | Ex. 6 |
|---|---|---|---|---|---|---|---|
| Composition | Silver powder | 80.0 | 80.0 | 80.0 | 80.0 | 80.0 | 80.0 |
|  | S-LEC KS-10 |  | 1.0 |  |  |  |  |
|  | Solbin AL |  |  | 1.0 | 1.0 | 1.0 | 1.0 |
|  | TRIXENE BI 7982 | 7.5 | 7.5 | 7.5 |  | 7.5 | 7.5 |
|  | TRIXENE BI 7992 |  |  |  | 7.5 |  |  |
|  | Coronate 2507 |  |  |  |  |  |  |
|  | Denacol EX-321 | 2.5 | 2.5 | 2.5 | 2.5 |  |  |
|  | Denacol EX-830 |  |  |  |  | 2.5 | 2.5 |
|  | Toho polyethylene glycol 400 |  |  |  |  |  |  |
|  | U-CAT SA 102 | 0.5 | 0.5 | 0.5 | 0.5 | 0.5 |  |
|  | U-CAT SA 603 |  |  |  |  |  | 0.5 |
|  | Curezol 2E4MZ |  |  |  |  |  |  |
|  | BDGAc | 9.5 | 8.5 | 8.5 | 8.5 | 8.5 | 8.5 |
| Volume resistivity (μΩ · cm) |  | 50 | 40 | 20 | 30 | 20 | 30 |
| Substrate adhesion |  | Acceptable | Acceptable | Acceptable | Acceptable | Acceptable | Acceptable |
| Printability |  | Good | Excellent | Excellent | Excellent | Excellent | Excellent |

[Table 2]

TABLE 2

|   |   | Comp. ex. 1 | Comp. ex. 2 | Comp. ex. 3 |
|---|---|---|---|---|
| Composition | Silver powder | 80.0 | 80.0 | 80.0 |
|  | S-LEC KS-10 | 1.0 |  | 1.0 |
|  | Solbin AL |  | 1.0 |  |
|  | TRIXENE BI 7982 | 7.5 |  | 7.5 |
|  | TRIXENE BI 7992 |  |  |  |
|  | Coronate 2507 |  | 6.5 |  |
|  | Denacol EX-321 |  | 2.5 | 2.5 |
|  | Denacol EX-830 |  |  |  |
|  | Toho polyethylene glycol 400 | 2.5 |  |  |
|  | U-CAT SA 102 | 0.5 | 0.5 |  |
|  | U-CAT SA 603 |  |  |  |
|  | Curezol 2E4MZ |  |  | 0.5 |
|  | BDGAc | 8.5 | 9.5 | 8.5 |
| Volume resistivity (μΩ · cm) |  | 500 | 300 | 200 |
| Substrate adhesion |  | Not acceptable | Not acceptable | Not acceptable |
| Printability |  | Poor | Good | Excellent |

Silver Powder

AG-2-1C (manufactured by DOWA Electronics materials Co., Ltd., average particle size D50: 0.8 μm) •S-LEC KS-10: acetal resin having a molecular weight of 17,000 and a glass transition temperature (Tg) of 106° C. (manufactured by Sekisui Chemical Co., Ltd.)

Solbin AL: vinyl chloride-vinyl acetate copolymer having a copolymer mass ratio of vinyl chloride/vinyl acetate/vinyl alcohol of 93/2/5, a number average molecular weight of 22,000, and a glass transition temperature (Tg) of 76° C. (manufactured by Nissin Chemical Co., Ltd.)

TRIXENE BI 7982: blocked isocyanate in which the blocking agent is 3,5-dimethylpyrazole (manufactured by Baxenden Chemicals Ltd.)

TRIXENE BI 7992: blocked isocyanate in which the blocking agents are 3,5-dimethylpyrazole and diethyl malonate (manufactured by Baxenden Chemicals Ltd.)

Coronate 2507: blocked isocyanate in which the blocking agent is MEK-oxime-type blocking agent (manufactured by Nippon Polyurethane Industry Co., Ltd.)

Denacol EX-321: trimethylolpropane polyglycidyl ether (manufactured by Nagase ChemteX Corporation)

Denacol EX-830: polyethylene glycol diglycidyl ether (manufactured by Nagase ChemteX Corporation)

Toho polyethylene glycol 400: polyethylene glycol (manufactured by TOHO Chemical Industry Co., Ltd.)

U-CAT SA 102: DBU-octylic acid salt (manufactured by San-Apro Ltd.)

U-CAT SA 603: DBU-formic acid salt (manufactured by San-Apro Ltd.)

Curezol 2E4MZ: 2-ethyl-4-methylimidazole (manufactured by Shikoku Chemicals Corporation) •BDGAc: diethylene glycol monobutyl ether acetate As understood from the evaluation results in Tables 1 and 2, the conductive ink compositions of Examples 1 to 6 containing an epoxy compound are at acceptable levels in terms of volume resistivity, substrate adhesion, and printability. In contrast, it is obvious that the conductive ink composition of Comparative example 1 which does not contain any epoxy compound is at non acceptable levels in terms of all the items. Further, it is obvious that the conductive ink composition of Comparative example 2 in which the blocking agent for the blocked isocyanate is not a low-temperature-dissociable blocking agent that is an active methylene compound and/or a pyrazole compound is at non acceptable levels in terms of volume resistivity and base adhesion. Furthermore, it is also obvious that the conductive ink composition of Comparative example 3 which does not contain any reaction catalyst for the blocked isocyanate is at non acceptable levels in terms of volume resistivity and base adhesion.

INDUSTRIAL APPLICABILITY

A conductive ink composition of the present invention can be used as a conductive silver paste for conductive pattern formation for a variety of electric components and electronic components.

The invention claimed is:

1. A conductive ink composition comprising a conductive filler, an epoxy resin comprising epoxy groups, a blocked polyisocyanate in which a blocking agent is an active methylene compound and/or a pyrazole compound, a reaction catalyst for the blocked polyisocyanate, and an organic solvent as essential components, wherein the reaction catalyst for the blocked polyisocyanate is an organic ammonium salt or an organic amidine, and wherein the reaction catalyst for the blocked polyisocyanate is 0.05 to 3 wt % of the conductive ink composition.

2. The conductive ink composition according to claim 1, wherein the conductive filler is a spherical silver powder having an average particle size of 0.1 to 10 μm.

3. The conductive ink composition according to claim 1, wherein the epoxy resin is a thermosetting aliphatic epoxy compound.

4. The conductive ink composition according to claim 1, further comprising a film-formable thermoplastic resin other than the epoxy resin.

5. A method for producing a conductive pattern, comprising applying the conductive ink composition according to claim 1 to a non-heat resistant substrate and heating the conductive ink composition.

6. A conductive circuit comprising a conductive pattern in which a cured coating film of the conductive ink composition according to claim 1 is formed on a non-heat resistant substrate.

7. The conductive ink composition according to claim 3, wherein the aliphatic epoxy compound is a glycidyl ether of polyethylene glycol, polypropylene glycol, hexanediol, trimethylolpropane, glycerin, pentaerythritol, or sorbitol.

8. The conductive ink composition according to claim 1, wherein the reaction catalyst for the blocked polyisocyanate is 0.1 to 1 wt % of the conductive ink composition.

* * * * *